United States Patent
Kim

(10) Patent No.: US 6,991,419 B2
(45) Date of Patent: Jan. 31, 2006

(54) METHOD AND APPARATUS FOR TRANSFERRING A WAFER

(75) Inventor: Ki-Sang Kim, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/120,477

(22) Filed: Apr. 10, 2002

(65) Prior Publication Data

US 2002/0150456 A1   Oct. 17, 2002

(30) Foreign Application Priority Data

Apr. 16, 2001   (KR) .............................. 2001-20147

(51) Int. Cl.
*B66C 23/00* (2006.01)

(52) U.S. Cl. .................. 414/680; 414/935; 414/941; 901/15

(58) Field of Classification Search ............... 414/728, 414/222.07, 225.01, 226.05, 590, 733, 744.5, 414/744.7, 941, 744.4, 682, 422, 935, 680, 414/729, 738; 901/15; 74/490.06, 490.05
See application file for complete search history.

(56) References Cited

U.S. PATENT DOCUMENTS

| | | | | |
|---|---|---|---|---|
| 2,933,205 A | * | 4/1960 | MacDonald | 414/735 |
| 3,033,059 A | * | 5/1962 | Melton | 414/728 |
| 4,382,743 A | * | 5/1983 | Newell | 414/692 |
| 4,685,861 A | * | 8/1987 | Huetsch | 414/729 |
| 4,699,556 A | * | 10/1987 | Foulke | 414/404 |
| 5,004,399 A | * | 4/1991 | Sullivan et al. | 414/416.03 |
| 5,550,953 A | * | 8/1996 | Seraji | 901/15 |
| 5,720,590 A | * | 2/1998 | Hofmeister | 414/744.2 |
| 5,807,449 A | * | 9/1998 | Hooker et al. | 156/64 |
| 5,879,460 A | * | 3/1999 | Begin et al. | 118/719 |
| 6,092,971 A | * | 7/2000 | Balg et al. | 414/416.03 |
| 6,155,768 A | * | 12/2000 | Bacchi et al. | 414/416.03 |
| 6,234,738 B1 | * | 5/2001 | Kimata et al. | 414/744.3 |
| 6,305,895 B1 | * | 10/2001 | Ozawa et al. | 414/217 |
| 6,382,902 B1 | * | 5/2002 | Sugimura | 414/805 |
| 6,450,757 B1 | * | 9/2002 | Saeki et al. | 414/744.5 |
| 6,491,491 B1 | * | 12/2002 | Tsuneda et al. | 414/744.5 |

FOREIGN PATENT DOCUMENTS

| | | |
|---|---|---|
| JP | 10-275848 | 11/1998 |
| JP | 2000-195922 | 7/2000 |

OTHER PUBLICATIONS

English language abstract for Japanese Patent No. 10-275848.
English language of Abstract for Japanese Patent No. 2000-195922, filed Jul. 14, 2000.

* cited by examiner

*Primary Examiner*—Eileen D. Lillis
*Assistant Examiner*—Michael Lowe
(74) *Attorney, Agent, or Firm*—Marger Johnson & McCollom, P.C.

(57) ABSTRACT

The present invention relates to a transfer apparatus for a wafer, in which the wafer may be transferred in a narrow space by reducing a transfer device footprint. The transfer device has a base, a lower arm, an upper arm and a hand. The lower arm is configured to be vertically adjustable and rotatable on a vertical axis. The upper arm is pivotably coupled to the lower arm, and the hand is horizontally coupled to the upper arm.

26 Claims, 12 Drawing Sheets

METHOD AND APPARATUS FOR TRANSFERRING A WAFER

This application relies for priority upon Korean Patent Application No. 2001-20147, filed on Apr. 16, 2001, the contents of which are herein incorporated by reference in their entirety.

BACKGROUND OF THE INVENTION

1. The Field of the Invention

The present invention relates to a transfer apparatus for transferring a semiconductor wafer. More particularly, the present invention relates to a transfer apparatus capable of transferring a semiconductor wafer in a narrow space by reducing a footprint.

2. Description of the Related Art

Generally, to fabricate devices such as a liquid crystal display (LCD) device, a plasma display device, or a semiconductor device, a cluster system has been frequently employed. A cluster system generally is used to indicate an apparatus for multiple process chambers comprising a transfer apparatus and a plurality of neighboring process modules. The cluster system is popular because the system can conduct multi-stage processes continuously and automatically.

For example, as disclosed in Japan Pat. No. 10-275848, a cluster system has an octagonal housing for an unloading chamber, and a transfer apparatus that rotates in the housing. Process modules may be set up at each side of the octagonal housing. The transfer apparatus removes a wafer from a load-lock cassette in a load-lock chamber, and loads the wafer into a process chamber of a process module. The wafer, after being processed in the process chamber, is removed from the transfer apparatus and loaded into the next process module, such as a load-lock module or the like.

The transfer apparatus used in the cluster system typically has a base, a first arm, a second arm and a handler. The first arm is positioned on the base and capable of rotation. The second arm is coupled to the top of the first arm and is also capable of rotation. The handler is coupled to the top of the second arm and is capable of rotation. Thus, the entire transfer apparatus is of a frog-leg type, composed of multiple joints adapted to rotate relative to one another.

Several problems exist with the transfer apparatus of the conventional cluster system as described above. Because wafers are handled horizontally, the cluster system arms require a wide space for horizontal rotation. Consequently, the transfer apparatus has a wide footprint and the entire working area of the apparatus is increased, reducing space efficiency per unit area. Such inefficient utilization of space additionally results in an increase in fabrication cost and inefficiency of automated transfer. Additionally, long arm length is required for covering the transfer distance, further limiting of processed amount thereby.

One approach to minimize the interference radius entails increasing the number of arms or pivots in the transfer apparatus, which raises concerns such as added mechanical complexity, reliability and maintenance.

SUMMARY OF THE INVENTION

It is an object of the present invention to provide a new-type transfer apparatus for a wafer, in which a footprint may be reduced.

The present invention is directed to a transfer apparatus for a wafer. The transfer device transfers a wafer from a transfer chamber into a process chamber contacted with the transfer chamber. The device comprises a base having rotatably coupled thereto a vertically adjustable lower arm. An upper arm is pivotably coupled at a first end to the lower arm, and a hand adapted to engage a wafer is pivotably coupled to a second end of the upper arm. The hand is configured to be always kept horizontal to the ground.

In the present invention, the pivots connecting the lower arm, the upper arm and the hand preferably are rotated by stepping motors.

A method for transferring a wafer from a first site to a second site is disclosed, comprising extending a hand into the first site to bring the hand in contact with an underside of the wafer supported on a wafer-supporting element at the first site. Extending includes pivoting an upper arm on a first horizontal pivot coupling said upper arm with a lower arm, and coordinately pivoting the hand on a second horizontal pivot coupling said hand with said upper arm. The wafer is lifted from the wafer-supporting element and the hand is retracted to remove the wafer from the first site. Retracting includes pivoting the upper arm on the first horizontal pivot, and coordinately pivoting the hand on the second horizontal pivot. The lower arm is rotated, to position the hand to face the second site, and the hand is extended into the second site to place the wafer on a wafer-supporting element at the second site. Extending includes pivoting an upper arm on a first horizontal pivot coupling said upper arm with a lower arm, coordinately pivoting the hand on a second horizontal pivot coupling said hand with said upper arm, and disengaging the wafer from the hand.

DESCRIPTION OF THE PREFERRED EMBODIMENT

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification.

Figure 1:
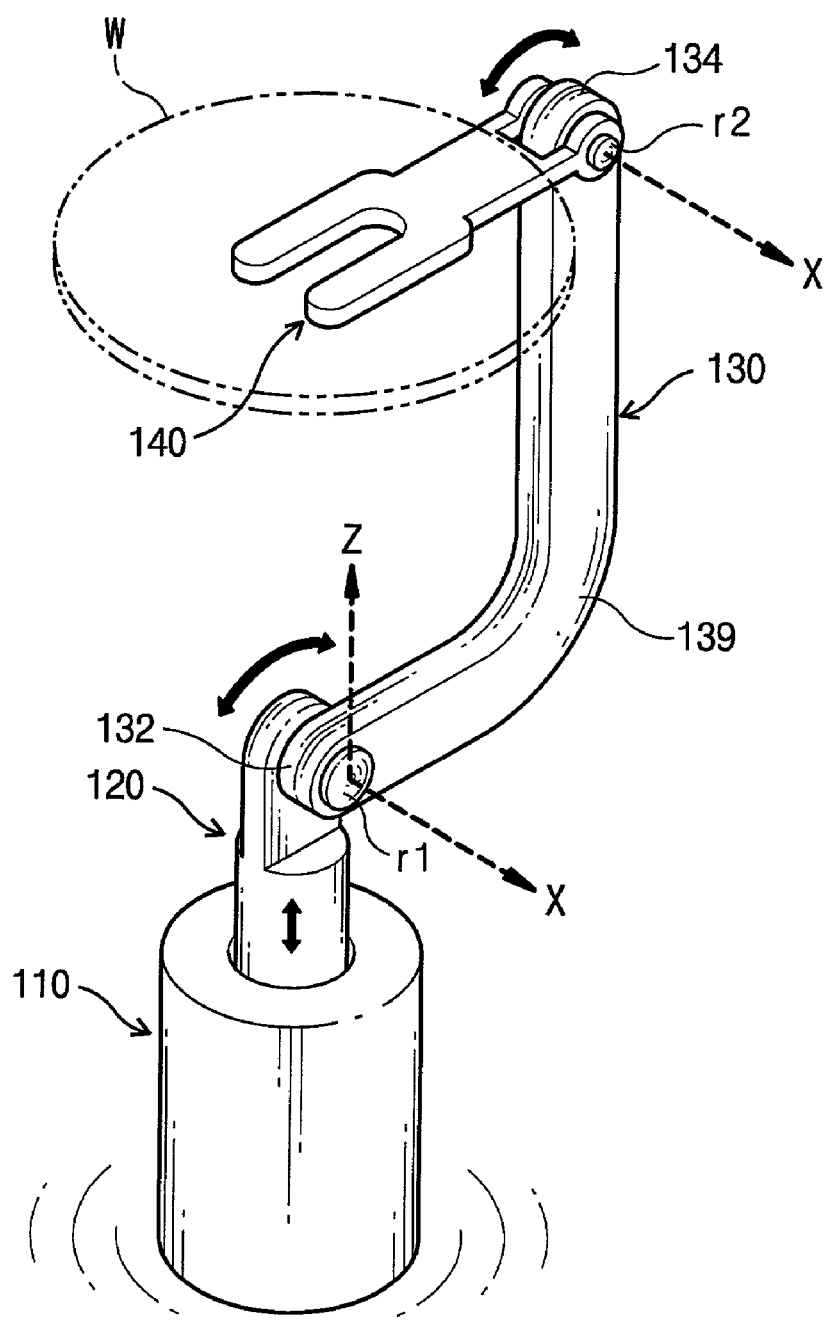
FIG. 1 is a schematic perspective view, showing a wafer transfer apparatus according to an embodiment of the present invention.
Figure 2:
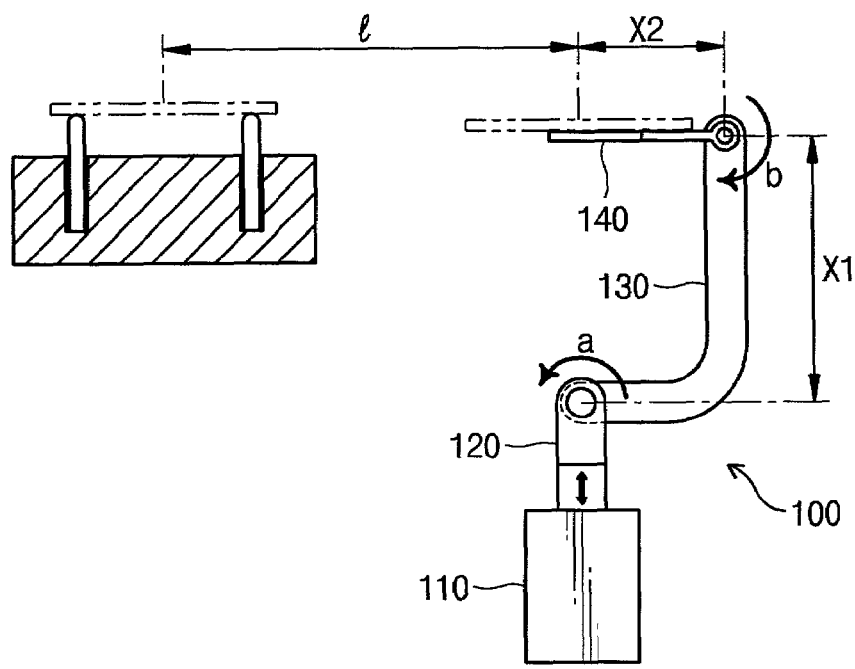
FIG. 2 is a schematic side view, showing the apparatus of FIG. 1 in an exemplary orientation with a wafer in a wafer cassette.
Figure 2:
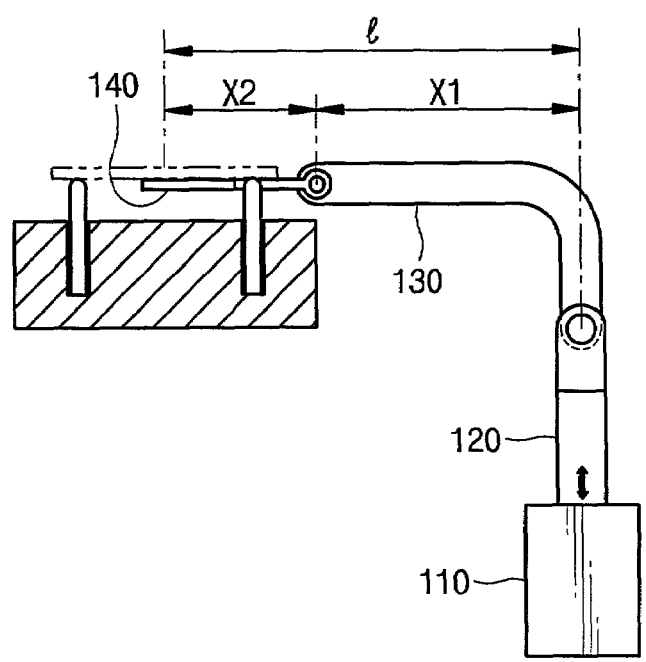

Referring to FIGS. 1–2, the present transfer apparatus 100 has a base 110, a lower arm 120, an upper arm 130 and a hand 140. The lower arm 120 is coupled to the base 110 to permit the lower arm 120 to move vertically as well as to rotate about a vertical axis (Z-axis).

Figure 10A:
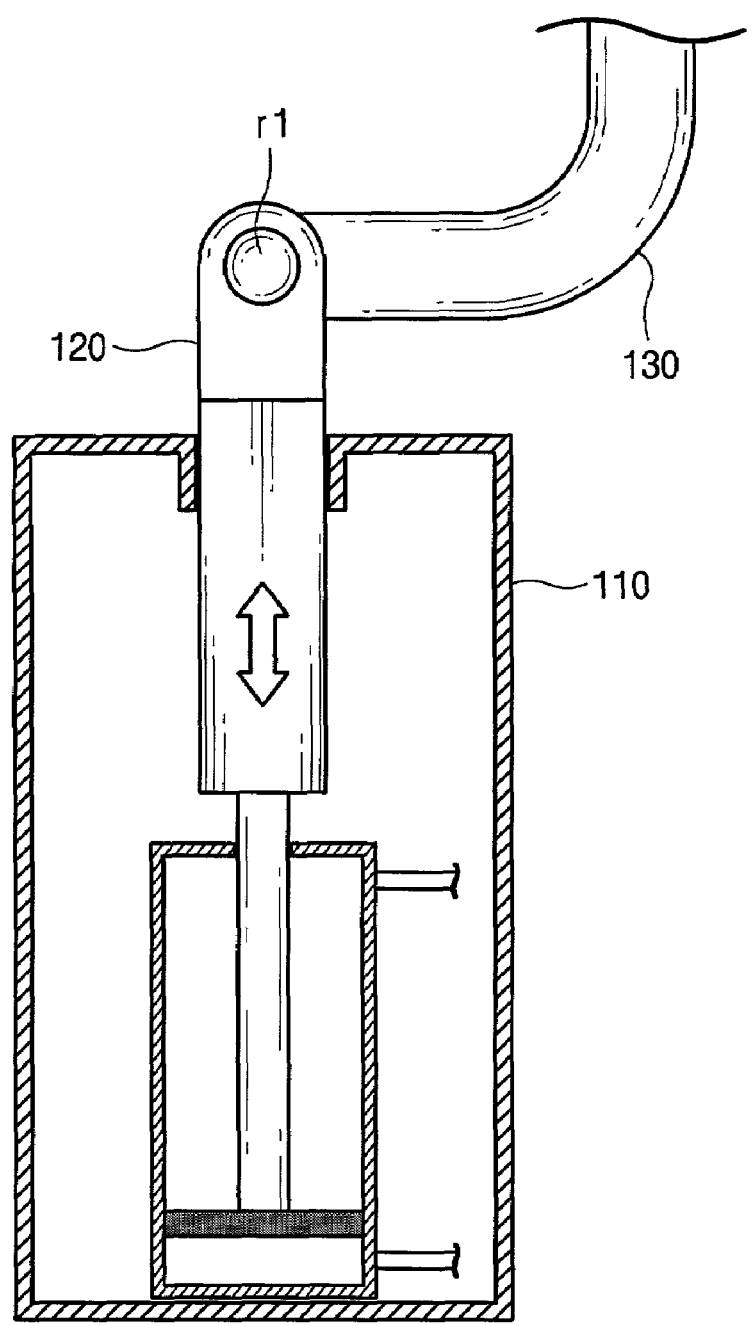
FIGS. 10A–10C are schematic diagrams showing various mechanisms and methods for moving a lower arm.
Figure 10B:
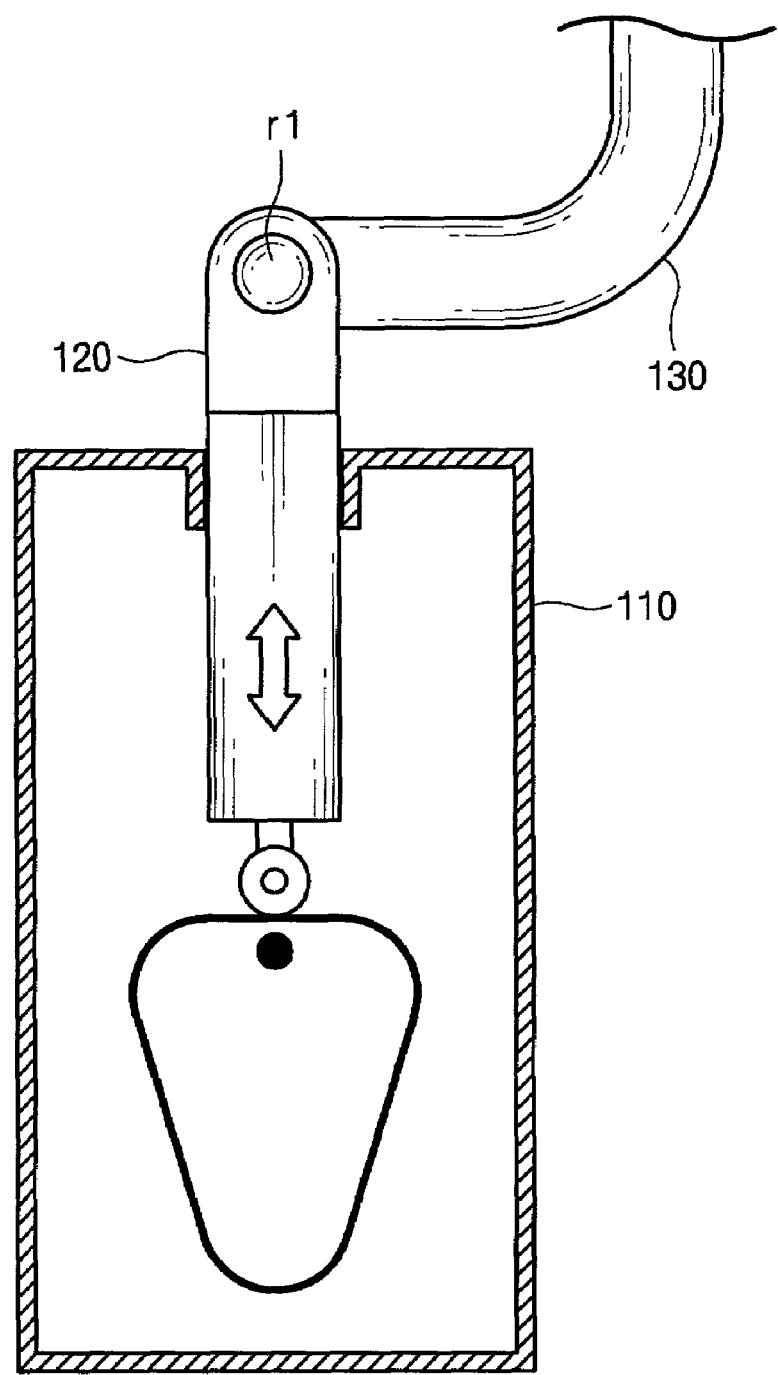
Figure 10C:
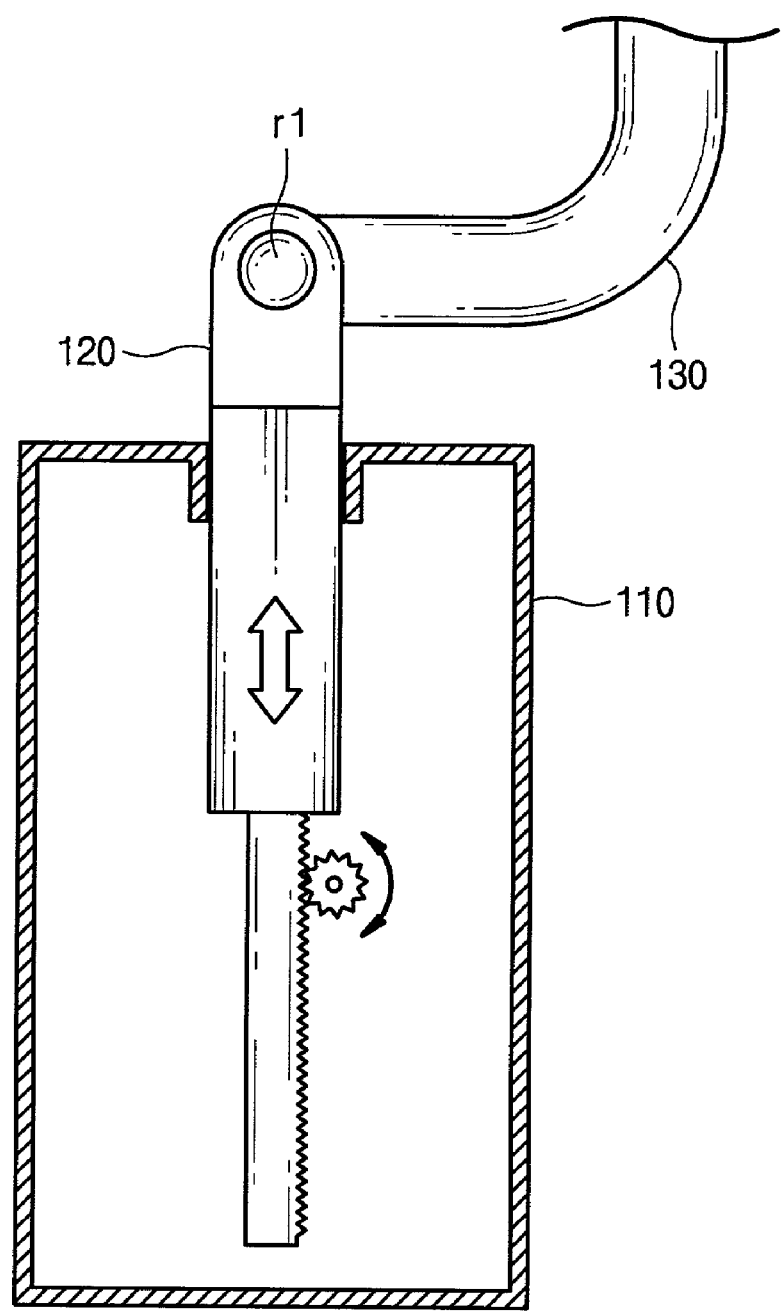

The vertical movement of the lower arm 120 may be carried by various mechanisms, such as a hydraulic or pneumatic cylinder (FIG. 10A), a cam (FIG. 10B), and a lack-gear (FIG. 10C).

The upper arm 130 has a first end 132 and a second end 134. Intermediate the first end 132 and second end 134 of the upper arm 130 is a curved section 139. As shown herein, the upper arm 130 is roughly L-shaped.

The upper arm 130 is horizontally pivotably coupled at a first end 132 to the lower arm 120 by an arm pivot r1. The arm pivot r1 is oriented along an X-axis and is configured to allow the upper arm 130 to rotate thereon. The upper arm 130, so coupled to the lower arm 120, can pivot in the Y-Z plane.

The hand 140 is horizontally pivotably coupled to a second end 134 of the upper arm 130 by a hand pivot r2. The hand 140 is configured to rotate on the hand pivot r2. The hand 140 preferably is configured to pivot on the hand pivot r2 in coordination with the pivoting of the upper arm 120 on the arm pivot r1. By such coordinated movement, the hand 140 can be maintained substantially horizontal.

In a resting (retracted) state, the base 110, the lower arm 120, the upper arm 130 and the hand 140 of the transfer apparatus are positioned so as to occupy a minimum "footprint" as viewed from above. The hand 140 is positioned substantially directly above the base 110 in this resting state.

The movements of the lower arm 120, the upper arm 130 and the hand 140 are controlled by stepping motors. Although coordinated movement of the apparatus in transferring a wafer is preferred, the movement of any one the above components can be undertaken individually or in concert.

In FIG. 2, measurements 1, X1, and X2 are given. The distances for X1 is measured in a vertical plane, while 1 and X2 are taken in a horizontal plane. The vertical distance between the centers of the arm pivot r1 and hand pivot r2 is labeled as X1. The distance from the hand pivot r2 to the center of a carried wafer W is denoted as X2. The distance between a wafer W to be transferred and a wafer W carried by the hand 140 is referred to as transfer distance 1. As can be seen in FIG. 2, the sum of X1 and X2 corresponds to transfer distance 1.

The hand 140, on which a wafer W can be held, rotates on the hand pivot r2 along a direction b (FIG. 2) so as to be oriented substantially horizontal while transferring a wafer W. The rotational movements of the arm pivot r1 and the hand pivot r2 are carried by correspondent driving devices, such as a stepping motor and a timing belt (not shown), respectively and independently. Driving means for the arms 120, 130 and the hand 140 are preferably realized by mechanical devices used for a conventional multi-pivot robot.

Figure 3:
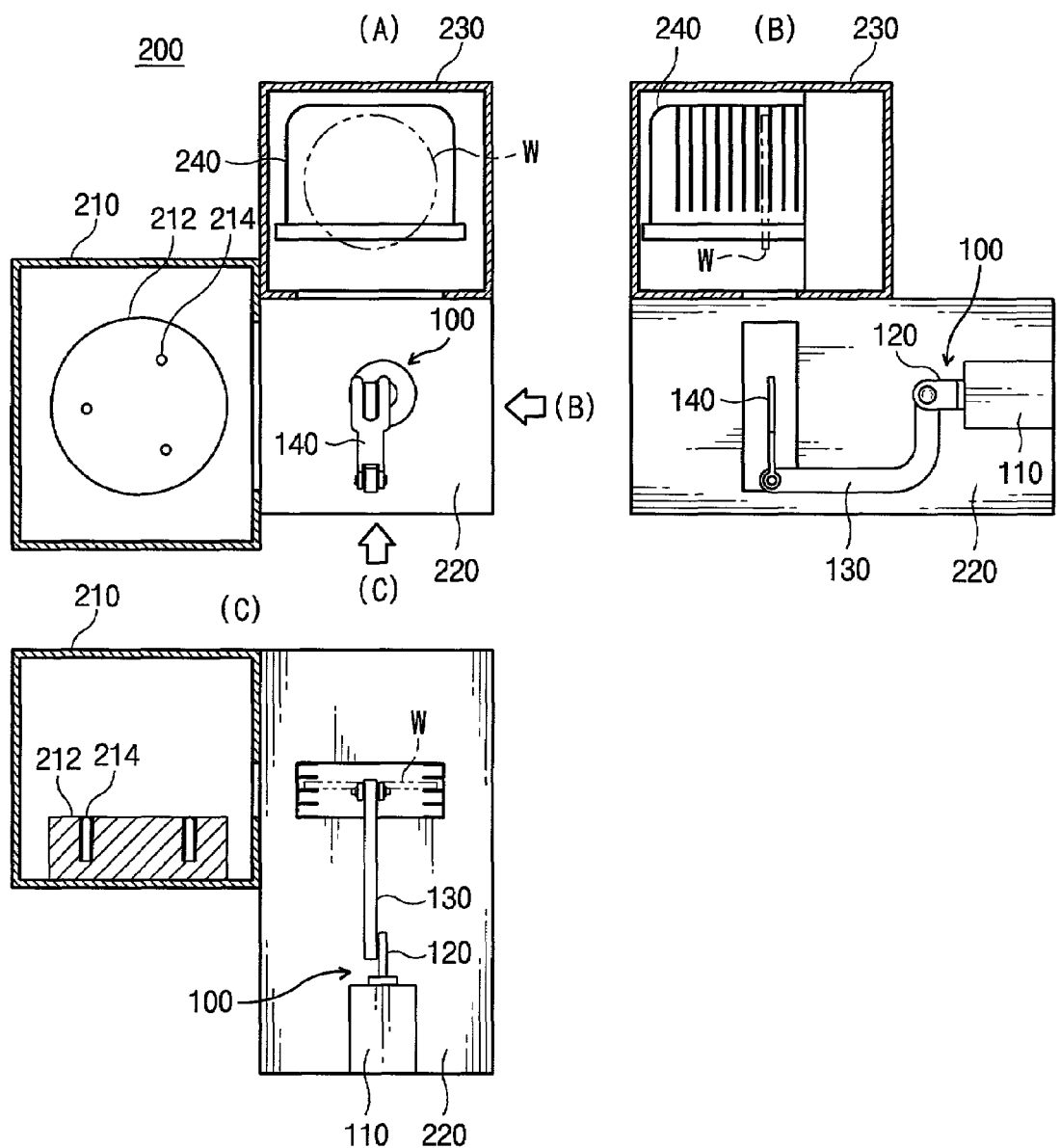
FIGS. 3–9 are schematic diagrams illustrating a first embodiment of a method for transferring a wafer to a process chamber from a wafer cassette in a load-lock chamber.

A primary advantage of the disclosed transfer apparatus is its reduced workspace footprint, especially while in operation. Referring to FIG. 3, a typical semiconductor fabrication set-up 200 includes a load-lock chamber 230 in which resides a wafer cassette 240, a process chamber 210 in which a wafer W is processed, and a transfer chamber 220 housing a transfer apparatus 100 as disclosed herein. It should be readily understood that the equipment 200 may comprise multiple process chambers adjacent to the transfer chamber 220. The transfer apparatus 100 serves to transfer a wafer W between a wafer cassette 240 and the process chamber 210.

As described above, in the transfer apparatus 100 of the present invention, the arm pivot r1 permits the upper arm 130 to rotate along the direction a (FIG. 2). By so rotating, the section of the upper arm 130 adjacent the first end 132 thereof can be parallel to the hand 140 when the transfer apparatus 100 is in an extended (reaching) state. By rotation in the opposite direction b on the pivot r1, the section of the upper arm 130 adjacent the first end 132 thereof again can be vertically positioned (retracted state).

In the retracted state, the lower arm 120 can rotate on the base 110 to change the direction in which the hand 140 can be extended. The present transfer apparatus therefore is capable of transferring wafers in a narrow space.

The method for transferring a wafer W using the above-described apparatus 100 is illustrated in FIGS. 3–9, in which reference letter (A) indicates a top plan view of a semiconductor fabricating set-up including a transfer apparatus 100 as disclosed herein; and reference letters (B) and (C) indicate, respectively, a side view and a front view of same.

Figure 4:
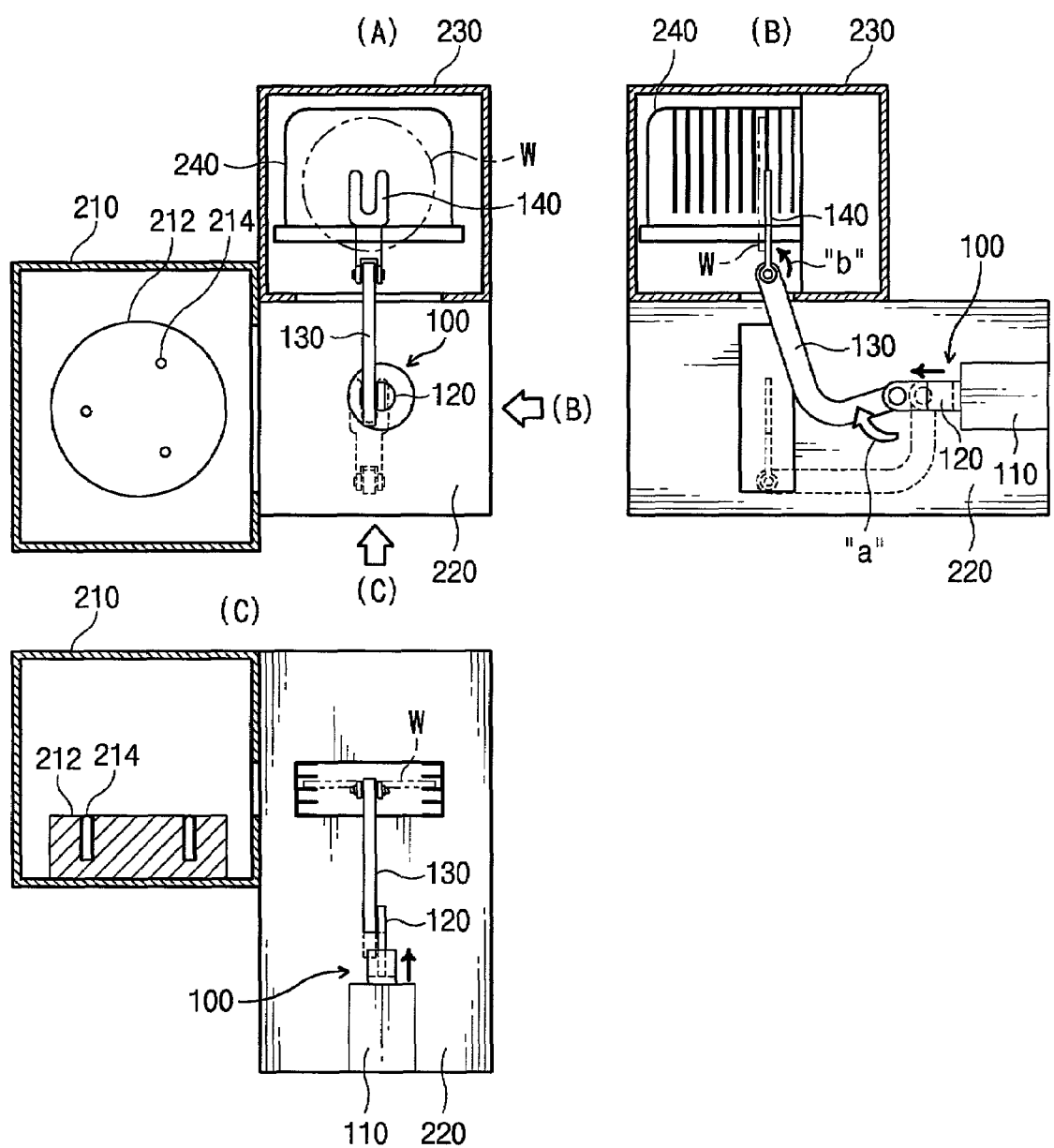

In FIG. 4, the lower arm 120 has been vertically displaced upward, and the upper arm 130 has rotated on the arm pivot r1. These motions result in the hand 140 moving forwardly and into the load-lock chamber 230 containing a wafer-supporting element such as a wafer cassette 240.

The forwardly-moving hand 140 has rotated on the hand pivot r2 to be oriented substantially horizontal, so as to be parallel to the wafer W in the cassette 240. The forwardly-moving hand 140 is shown engaging a wafer W in the cassette 240.

Figure 5:
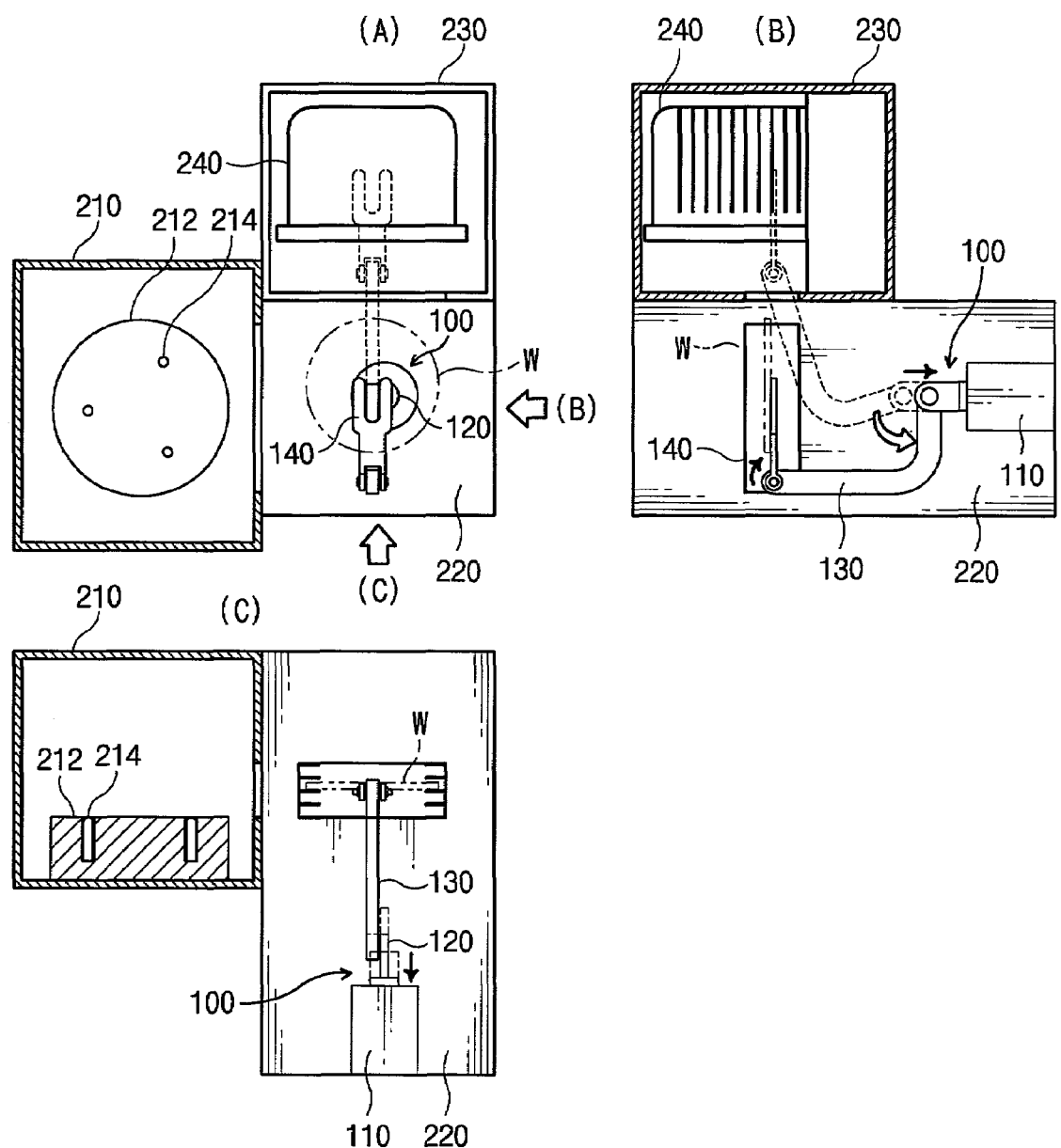

After engaging the wafer W, the hand 140 of the transfer apparatus 100 moves backwardly (FIG. 5). The lower arm 110 also has lowered vertically, to vertically position the hand 140 at the appropriate height for placement of wafer W into the processing chamber 210.

Engaging the wafer W can be accomplished by raising the lower arm 120 from the base 110, retracting the upper arm 130 by rotation about the arm pivot r1, or a combination of these motions. It should be noted that a combination of the above motions preferably will be performed, so as to lift the hand 140 only so far as is necessary to engage the wafer W without undesirably contacting the wafer W with other objects.

Figure 6:
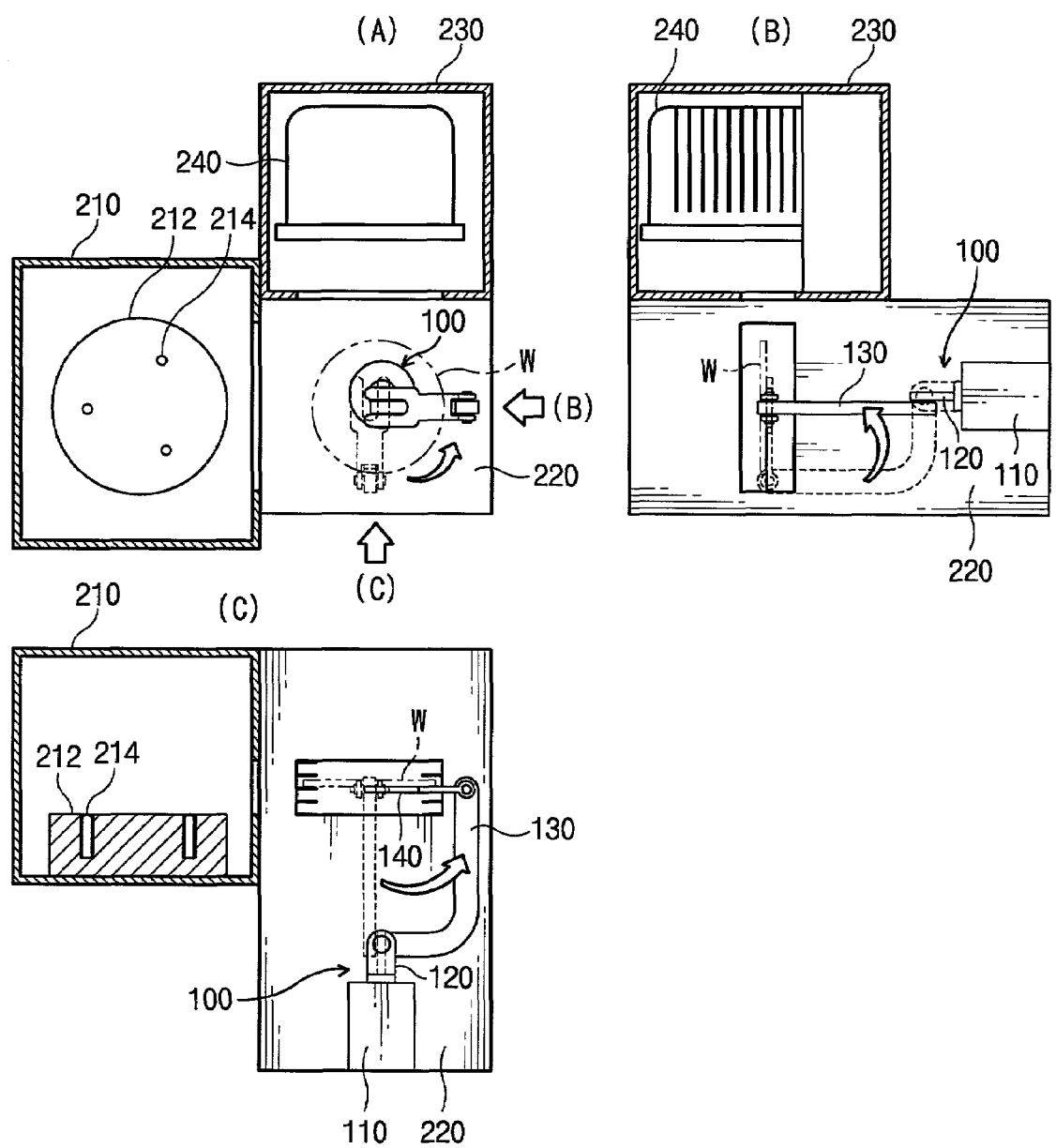
Figure 7:
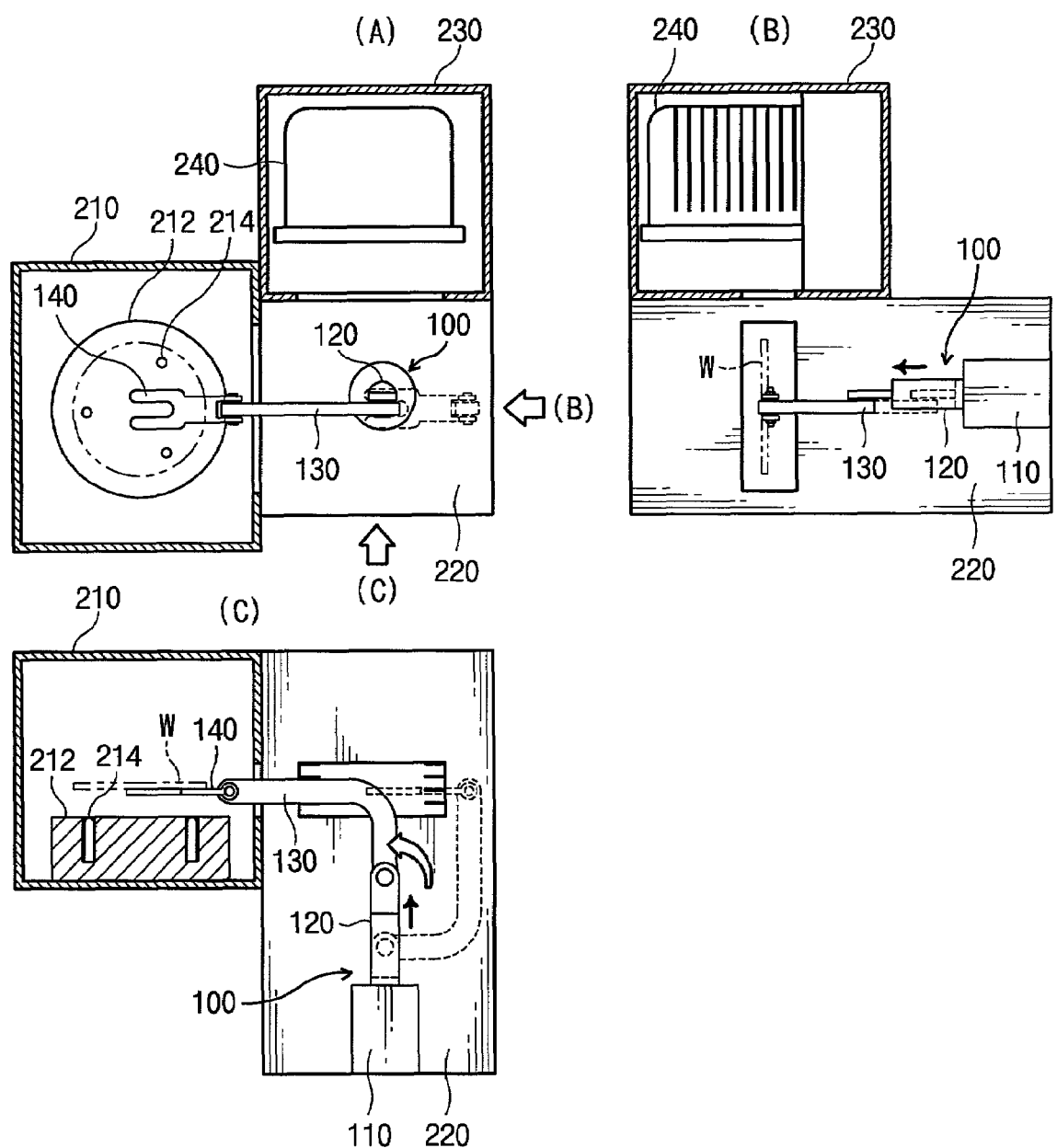
Figure 8:
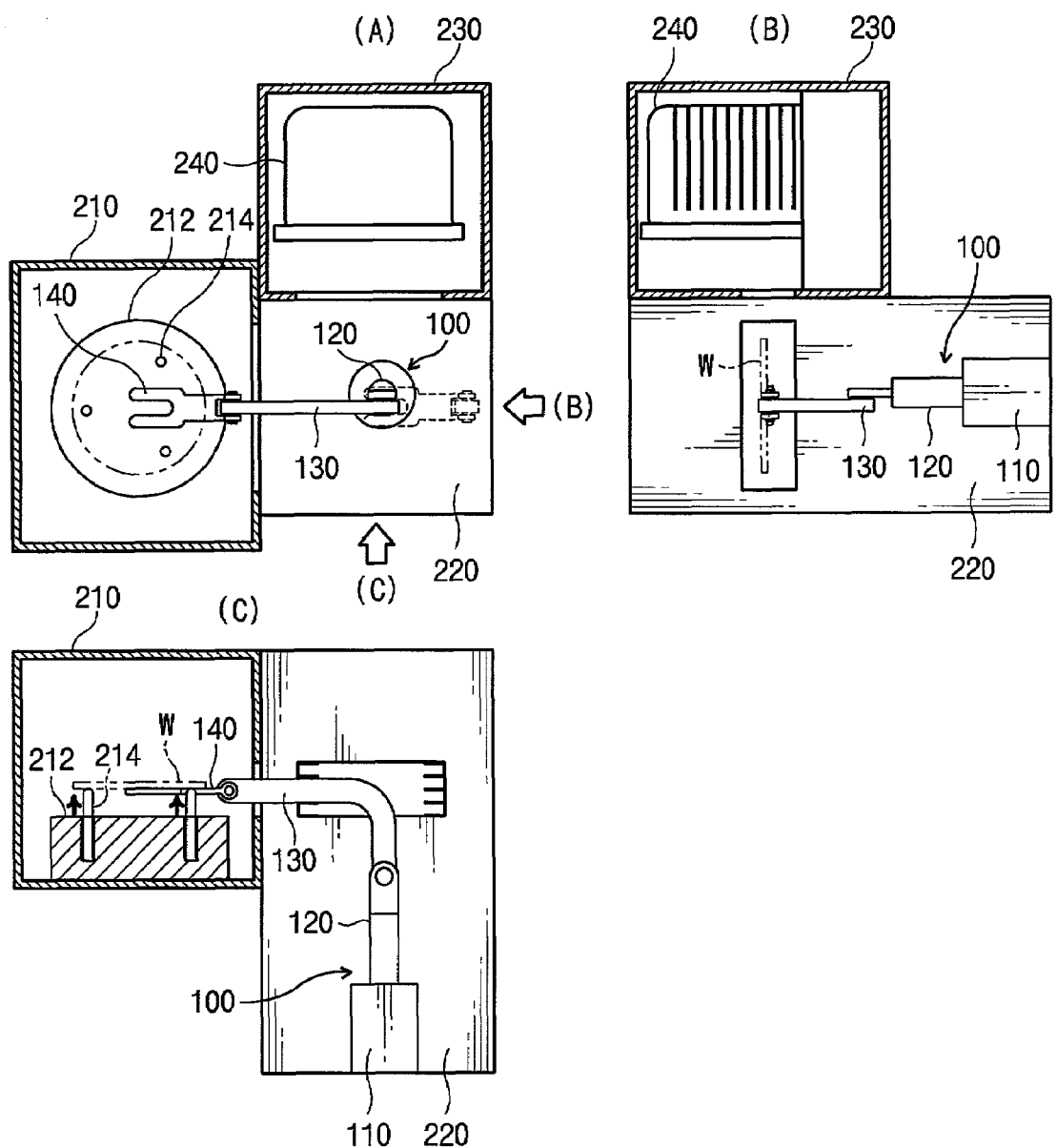
Figure 9:
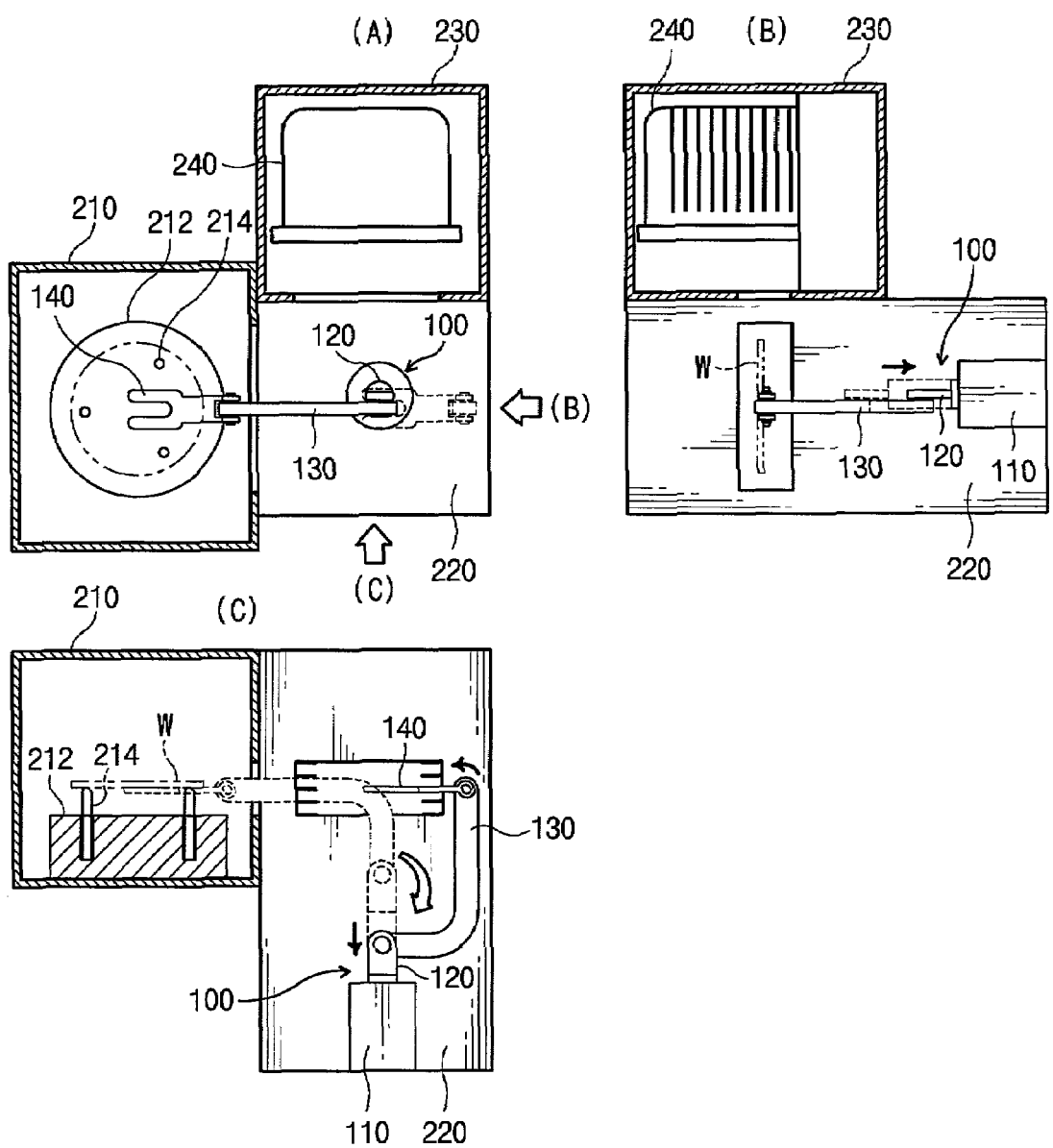

FIGS. 6–9 show a wafer W loaded onto a stage 212 in a process chamber 210. The transfer apparatus 100 is shown in the retracted state, holding a wafer W. To place the wafer W in the process chamber 210, the lower arm 120 rotates 90° about the Z-axis, so that the hand 140 is turned toward the process chamber 210 (FIG. 6).

The subsequent steps are identical to those recited above for removing a wafer W from a cassette 240. Specifically, the lower arm 120 moves vertically as required to position the wafer W at the appropriate height for placement onto the stage 212.

Simultaneously, the upper arm 130 rotates on the arm pivot r1 to extend the hand 140 forward and toward the process chamber 210. The wafer W preferably is held on the hand 140 by friction; for this reason, it is preferred that the forwardly-moving hand 140 rotate on the hand pivot r2 to hold an orientation substantially horizontal to the ground and parallel to the stage 212 so as to prevent the wafer W from sliding off the hand 140.

The wafer W is placed on the lift pins 214 protruding from the stage 212 by either lowering the wafer W onto the pins 214 or by the wafer pins 214 rising from the stage 212 to contact the wafer W and lift the wafer from the hand 140. The transfer apparatus 100 then retracts, as previously described, and can return to a retracted state or transfer a next wafer.

By similar motions, a processed wafer W in the process chamber 210 can be removed by the transfer device 100 and loaded into a chamber, such as a load-lock chamber.

One advantage of the transfer apparatus 100 as disclosed herein is that the upper arm 130 requires less "elbow room" that mechanized arms of the prior art, although the upper arm 130 can extend the transfer distance to reach a wafer W in the cassette 240 and the stage 212 in the process chamber 210.

Accordingly, when a wafer W is transferred by the transfer apparatus 100, it is possible to minimize an interference radius of an arm thereof, and thus to set up an equipment of a semiconductor in a narrow space.

The transfer apparatus 100 therefore possesses a minimum footprint. Such advantage may be exploited to assemble a cluster system to perform multi-step processes continuously and automatically, such as fabrication of an LCD device, a plasma display device, or a semiconductor device.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure unnecessarily the invention.

While the invention has been disclosed in its preferred form, the specific embodiments presented herein are not to be considered in a limiting sense. Indeed, it should be readily apparent to those skilled in the art in view of the present description that the invention can be modified in numerous ways. The inventor regards the subject matter of the invention to include all combinations and sub-combinations of the various elements, features, functions and/or properties disclosed herein.

What is claimed is:

1. A transfer apparatus for a wafer, comprising:
   a base;
   only two arms, including one lower arm comprising a single link and configured to be vertically and rotatably adjustable relative to the base and including one non-extensible and nonlinear upper arm comprising a single link and having a first end and a second end;
   a horizontal arm pivot coupling the first end of the upper arm to the lower arm, the horizontal arm pivot configured to allow the upper arm to pivot thereon in a single pivot plane;
   an end effector hand adapted to engage a wafer without contacting an upper surface of said wafer; and
   a horizontal hand pivot coupling the hand to the second end of the upper arm, the horizontal hand pivot configured to allow the hand to pivot thereon in the single pivot plane,
   wherein the upper and lower arms are structured to allow the upper arm and end effector hand to be in a first position such that the end effector hand is positioned to hold a wafer generally centered over the horizontal arm pivot,
   and the upper and lower arms are structured to allow the upper arm and end effector hand to be in a second position such that the upper arm is pivoted approximately 90° from the first position, the end effector hand is in a horizontal position, and a portion of the upper arm near the end effector hand is generally parallel to the end effector hand.

2. The transfer apparatus of claim 1, wherein the upper arm includes a curved section intermediate the first and second ends.

3. The transfer apparatus of claim 1, wherein the upper arm includes an angled portion intermediate the first and second ends.

4. The transfer apparatus of claim 3, wherein the upper arm is L-shaped.

5. The transfer apparatus of claim 1, wherein the upper arm is vertically adjustable relative to a horizontal plane defined by the base and the hand can engage a wafer that is on the opposite side of the horizontal plane from the arm pivot.

6. The transfer apparatus of claim 1, wherein the lower arm, the upper arm, and the hand are independently movable.

7. The transfer apparatus of claim 1, wherein the lower arm, the upper arm, and the hand are coordinately movable.

8. The transfer apparatus of claim 1, wherein the hand is configured to be maintained in a horizontal orientation.

9. The transfer apparatus of claim 1, wherein each of the lower arm, the upper arm, and the hand is adapted to be moved by a motor.

10. The transfer apparatus of claim 1 wherein said transfer apparatus is structured to avoid occupation of an area directly above a wafer placed on said hand through a full range of motion of said transfer apparatus.

11. The transfer apparatus of claim 1 wherein said transfer apparatus has a horizontal operating space requirement and a vertical reach, and the horizontal operating space requirement is less than the vertical reach.

12. The transfer apparatus of claim 1 wherein said transfer apparatus is structured to rotate between first and second chambers located substantially 180 degrees apart while non-mechanically retaining said wafer on said hand.

13. A method for transferring a wafer, comprising:
   rotating a lower arm on a vertical axis;
   moving the lower arm vertically;
   rotating a nonlinear and non-extensible upper arm on a horizontal arm pivot connecting the upper arm with the lower arm;
   rotating a non-extensible hand along a horizontal hand pivot connecting the hand with the upper arm, thereby keeping the hand horizontal engaging said wafer with said hand;
   maintaining the engaged wafer at or above a horizontal plane including one of said arm pivot or said hand pivot; and
   extending the hand and a portion of the non-linear upper arm that is generally horizontal to the hand through a slot-type chamber opening by rotating the upper arm approximately 90° around the horizontal arm pivot.

14. The method as claimed in claim 13, wherein the hand rotates in a direction opposite to a direction in which the upper arm rotates.

15. The method of claim 13, further comprising rotating the lower arm on a vertical axis.

16. The method of claim 13, wherein the upper arm and the hand rotate in opposite directions.

17. A wafer transfer apparatus, comprising:
   a base;
   only two arms including one lower arm comprising a single link and having a first end and a second end and said two arms further including including one rigid and nonlinear upper arm comprising a single link and having a first end and a second end;
   an end effector hand adapted to engage a wafer by contacting at least one wafer surface selected from the group consisting of a lower wafer surface and a wafer edge surface; and
   only three pivots:
      a shoulder pivot acting in a vertical axis and coupling the base and the lower arm, said shoulder pivot structured to permit the lower arm to be vertically and rotatably adjustable relative to the base, an elbow pivot coupling the lower arm to the first end of the upper arm, the elbow pivot horizontally oriented to allow the upper arm to pivot thereon in a single pivot plane, and a wrist pivot coupling the hand to the second end of the upper arm, the wrist pivot horizontally oriented to allow the hand to pivot thereon in the single pivot plane, wherein said base, lower arm, nonlinear upper arm and end effector hand are arranged to retain an engaged wafer during a wafer transfer process at or above a horizontal plane defined by vertically uppermost pivot of said three pivots; and wherein said apparatus structured to hold a wafer generally centered over the shoulder pivot in a first position and structured to transfer a wafer on said end effector through a slot-type chamber opening disposed no lower than an elevation of said wrist pivot to a second position when a portion of the upper arm near the second end of the upper arm is generally parallel to the end effector band and the upper arm is rotated approximately 90° from the first position.

18. The transfer apparatus of claim 17 wherein the lower arm, the upper arm, and the end effector hand are coordinately movable.

19. The transfer apparatus of claim 17 wherein the end effector hand is configured to be maintained in a horizontal orientation during operation of the apparatus.

20. The transfer apparatus of claim 17 wherein said transfer apparatus is structured to avoid occupation of an area directly above a wafer placed on said hand through a full range of motion of said transfer apparatus.

21. The transfer apparatus of claim 17 wherein said transfer apparatus has a horizontal operating space requirement and a vertical reach, and the horizontal operating space requirement is less than the vertical reach.

22. The transfer apparatus of claim 17 wherein said transfer apparatus is structured to rotate between first and second chambers located substantially 180 degrees apart while non-mechanically retaining said wafer on said hand.

23. A wafer transferring apparatus, comprising:

a vertically oriented annular base;

a cylindrical shaft disposed within the annular base adapted to rotate and vertically translate within the annular base and including a first circular hinge connection located on an end of the shaft protruding from the annular base;

a rigid arm including a first shorter length having a first end and a second longer length having a second end, the two lengths being separated by a substantially right angled bend, the first end pivotably connected to the first circular hinge connection on the cylindrical shaft, and the second end having a second circular hinge connection having a horizontal axis of rotation parallel to an axis of rotation of the first circular hinge connection; and a rigid, non-extensible hand pivotably connected to the second circular hinge connection on the second end of the rigid arm and including a substantially planar surface parallel to the axis of rotation of the second circular hinge that is sized and shaped to hold a semiconductor wafer.

24. The wafer transferring apparatus of claim 23, wherein the first end of the rigid arm is pivotably connected to one side of the first circular hinge connection of the cylindrical shaft.

25. The wafer transferring apparatus of claim 23, wherein the rigid, non-extensible hand is pivotably connected to both sides of the second circular hinge connection on the second end of the rigid arm.

26. The wafer transferring apparatus of claim 23, wherein the rigid, non-extensible hand is fork-shaped.

\* \* \* \* \*

UNITED STATES PATENT AND TRADEMARK OFFICE
CERTIFICATE OF CORRECTION

PATENT NO. : 6,991,419 B2 Page 1 of 1
APPLICATION NO. : 10/120477
DATED : January 31, 2006
INVENTOR(S) : Kim It is certified that error appears in the above-identified patent and that said Letters Patent is hereby corrected as shown below:

At column 6, line 36, pleas replace "hand horizontal engaging" with --hand horizontal; ¶ engaging--

Signed and Sealed this

Ninth Day of January, 2007

JON W. DUDAS
*Director of the United States Patent and Trademark Office*